United States Patent [19]
Hotta

[11] Patent Number: 5,821,628
[45] Date of Patent: Oct. 13, 1998

[54] SEMICONDUCTOR DEVICE AND TWO-LAYER LEAD FRAME FOR IT

[75] Inventor: Yuji Hotta, Osaka, Japan

[73] Assignee: Nitto Denko Corporation, Osaka, Japan

[21] Appl. No.: 978,865

[22] Filed: Nov. 28, 1997

[30] Foreign Application Priority Data

Nov. 28, 1996 [JP] Japan .................................. 8-318141

[51] Int. Cl.$^6$ .................................................. H01L 23/12
[52] U.S. Cl. .......................... 257/783; 257/782; 257/666; 257/784
[58] Field of Search .................................. 257/782, 783, 257/666, 676, 784

[56] References Cited

U.S. PATENT DOCUMENTS 5,252,855 10/1993 Ogawa et al. .......................... 257/783
5,691,567 11/1997 Lo et al. .................................. 257/783
5,742,096 4/1998 Lee .......................................... 257/666

FOREIGN PATENT DOCUMENTS 4-340258 11/1993 Japan .............................. H01L 23/29

*Primary Examiner*—Mahshid D. Saadat
*Assistant Examiner*—S. V. Clark
*Attorney, Agent, or Firm*—Sughrue, Mion, Zinn, Macpeak & Seas, PLLC

[57] ABSTRACT

By employing the structure that in a two-layer lead frame comprising a lamination layer of lead portions and a metal layer, the thickness of an adhesive layer for fixing the a semiconductor element to the adhesive layer is defined to be from 100 to 350 μm and the semiconductor element is buried in the adhesive layer in a depth of at least 1/30 the thickness of the semiconductor element, the extent of the unevenness in the resin-sealed region is reduced and the occurrences of die shift and void are restrained.

10 Claims, 2 Drawing Sheets

SEMICONDUCTOR DEVICE AND TWO-LAYER LEAD FRAME FOR IT

BACKGROUND OF THE INVENTION

1. Field of the Invention

The present invention relates to a semiconductor device equipped with a two-layer lead frame and to a two-layer lead frame suitably used for it.

2. Description of the Conventional Art

In resin-sealing-type semiconductor devices, hitherto, many of these devices are rein-sealed by a transfer molding method. The transfer molding method is generally a method of resin-sealing a semiconductor element and a part of a lead frame by injecting a resin in a molten state into a die cavity in a state that a part of the lead frame mounting the semiconductor element is inserted in the cavity using a transfer molding machine. This method has been widely used over a period of more than 10 years, the technique thereof has been established, and a stable mass production is possible with respect to the conventional sealing of general semiconductor devices.

On the other hand, in view of a problem of generating a large amount of resin wastes caused by the inferior utilization efficiency of a sealing resin in the transfer molding method or the lowness of the flexibility for the production of small amounts of many kinds of products in the transfer molding method, etc., a method called as a so-called sheet molding method, etc., of carrying out resin sealing by forming a sealing resin into a label form or a sheet form and sticking it to a semiconductor element by heat-pressing is recently proposed (for example, Japanese Patent Publication No. Hei. 4-340258).

Also, in resin-sealing-type semiconductor devices, based on the requirement for the high heat radiation accompanied with the increase of the power of a semiconductor element, a two-layer lead frame of laminating a metal foil on a lead frame and mounting a semiconductor element on the metal foil to diffuse heat has been used.

Now, recently, with the transfer of electronic instruments into small-sized ones, thinned ones, etc., thinned semiconductor devices have been strongly required in the market and also, in resin-sealed-type semiconductor devices using a two-layer lead frame, very thin-type ones having a thickness of, for example, 0.8 mm or thinner have been required.

When a semiconductor device is thinned as described above, the following problems occur at resin sealing.

That is, in the transfer molding method of requiring flowing in a molten resin in a die cavity, there are problems that when the thickness of the whole device is reduced to about 0.8 mm or thinner, the cavity becomes very thin and it becomes difficult to flow in the molten resin in the narrow cavity as well as because the unevenness exists in the space of the inside thereof by the existence of a semiconductor element, unfilled portions (void) of the resin, die shift, etc., occur to lower the reliability of the semiconductor devices obtained and also to greatly lower the mass productivity.

Also, in the sheet molding method of using a sealing resin formed into a label form or a sheet form, the above-described severe problems accompanied by thinning do not occur but the sheet molding method essentially has the disadvantage that void is liable to form in a sealing resin and thus the reliability of semiconductor devices obtained is low and for preventing the occurrence of the disadvantage, it is proposed to use a molding die having a complicated structure equipped with a specific air bent as the molding die used at sticking a sealing resin of a label form or a sheet form to a semiconductor element (for example, Japanese Patent Publication No. Hei. 5-343458), however, even in the case of using the proposition, it cannot be said that the effect of preventing the occurrence of the void is sufficient and this point is the cause of delaying the practical use of the resin sealing process using the sheet molding method.

SUMMARY OF THE INVENTION

The present invention has been made under the circumstances and an object of the present invention is to provide a semiconductor device having the structure that when the device is thinned to about 0.8 mm or thinner, a void and die shift scarcely form by applying resin sealing by a transfer molding method and also a void is hard to form by applying resin sealing by a sheet molding method, whereby the mass productivity and the reliability are not reduced when the device is thinned, and to provide a two-layer lead frame suitable used for the semiconductor device.

For achieving the above-described object, the semiconductor device of the present invention is a semiconductor device equipped with a two-layer lead frame comprising a metal layer for mounting a semiconductor element via an adhesive layer and lead portions laminated each other, wherein the thickness of the above-described adhesive layer is from 100 to 350 μm and the semiconductor element is buried in the adhesive layer in the depth of at least ⅓ of the thickness of the semiconductor element.

The semiconductor device of the present invention having the above-described fundamental structure is particularly effectively applied to a thin-type semiconductor device as will be described later, thus the thickness thereof can be reduced to from 400 to 800 μm, and it is preferred that such a thin thickness can correspond to the tendency of thinning of semiconductor devices.

Also, in the case of obtaining the thin-type semiconductor device as described above by applying the present invention, the thickness of the semiconductor element used is from 150 to 400 μm.

Now, in the semiconductor device of the present invention a constitution that the surface of the opposite side of the two-layer lead frame to the side of fixing a semiconductor element is exposed on one surface (first surface) of said semiconductor device can be employed and according to the constitution, the semiconductor device becomes a so-called one-surface mold type, which can be a construction more suitable for achieving thinning of semiconductor devices.

Also, a constitution that a metal foil layer is formed on the other surface (second surface) of the opposite side of the first surface, that is, the other surface (second surface) of the semiconductor device corresponding to the circuit surface side of the semiconductor element can be employed and the existence of such a metal foil layer prevents lowering of the strength of the semiconductor device accompanied by thinning thereof and at the same time restrains a sealing resin from moisture absorption, and also has a function as the member for improving the heat-radiating property.

On the other hand, the two-layer lead frame of the present invention is a two-layer frame suitably used for the semiconductor device of the present invention and is a two-layer frame comprising of a metal layer for mounting a semiconductor element via an adhesive layer and lead portions laminated each other, wherein that the thickness of the adhesive layer is from 100 to 350 μm.

In the semiconductor device and the two-layer lead frame of the present invention, if the thickness of the adhesive layer for adhering the metal layer for mounting a semiconductor element and lead portions is less than 100 μm, the difference in level between the surface of the adhesive layer and the surface of the semiconductor element in the state that the semiconductor element is buried in the adhesive layer becomes large, whereby the semiconductor device becomes liable to contain void in the sealing resin and also becomes liable to be cracked when the device is applied with a heat cycle, which are undesirable. Also, the thickness of the adhesive layer exceeds 350 μm, it becomes difficult to fix the semiconductor element, which is also undesirable.

Now, the material of the lead portions in the semiconductor device and the two-layer lead frame of the present invention is copper alloys, a 42 alloy (42 nickel-iron alloy), etc., which are frequently used in the present field and the thickness of the lead portions is usually from 100 to 300 μm.

Also, the material of the metal layer for mounting and fixing a semiconductor element in the semiconductor device and the two-layer lead frame of the present invention can be optionally selected but is preferably Ni, Cu, Al, or alloys such as a 42 alloy, a 45 alloy (45 nickel-iron alloy), stainless steel, etc. Also, the thickness thereof is preferably from 6 to 150 μm.

In the semiconductor device and the two-layer lead frame of the present invention, the adhesive layer formed on the above-described metal layer for fixing by adhesion a semiconductor element also functions as a layer for adhering the lead portions and the metal layer, and as the material for the adhesive layer, various kinds of materials commonly used in the field of the art can be optionally used. Practically, as a thermoplastic resin, there are resins having a glass transition point of 200° C. or higher, such as, for example, a polyetherimide resin, a polyamidoimide resin, etc., and as a thermosetting resin, there are, for example, an epoxy resin, an acrylic resin, a polyester resin, a polyimide resin, etc. Also, as the material which is most suitably used for the adhesive layer, there is a polycarbodiimide resin having a low hygroscopic property and a low modulus of elasticity, and having a high glass transition point. The polycarbodiimide resin is represented by following general formula (1) and -R-in the formula (1) may be any one of the structural formulae (A) to (D).

 (1)

wherein -R- represents:

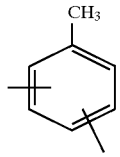 (A)

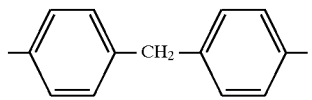 (B)

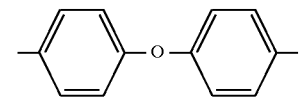 (C)

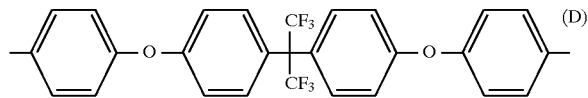 (D)

Also, in the adhesive layer, to the above-described each resin may be added various additives, for example, a filler such as silica and alumina, a curing catalyst, and a plasticizer.

As the method of fixing a semiconductor element to the metal layer via the adhesive layer, a method of press-adhering the semiconductor element in a state that the adhesive layer is softened or melted by heating until the semiconductor element is buried in the adhesive layer in the depth of at least ⅓ of the thickness of the element can be employed. By the method, the difference between the thickness of a sealed resin on the semiconductor element and the thickness of the adhesive layer at resin-sealing the semiconductor element becomes less, whereby the stress generated in the sealed resin becomes less and the reliability is improved.

For resin sealing of the semiconductor device of the present invention, a transfer molding method which is most usually used in the field of the art and known materials, for example, various thermosetting resins such as an epoxy resin, a polyimide resin, a maleimide resin, a silicone resin, an resin, etc., can be used. In the sealing resins, the polycarbodiimide resin is also a most preferred material as the sealing resin in the semiconductor of the present invention, in particular, owing to the low hygroscopic property. Each of these sealing resins may contain various materials known in the field of the art, such as various curing agents, curing catalysts, plasticizers, fillers, flame retardants, low-stress materials, etc.

Further, for resin sealing of the semiconductor device of the present invention, the aforementioned sheet molding method using a sealing material with label form or sheet form can be used. By adopting this method, it is possible to enhance the productivity. In this case, if the sealing material with label form or sheet form is constituted as a laminated structure of the sealing resin and the metal foil, that is, the sealing resin is laminated on the other surface (second surface) of the metal foil as a base material, it is possible to easily obtain a semiconductor device in which one principal surface thereof is covered with the metal foil layer without adding special processes at the sealing of resin. And is is possible to obtain the semiconductor device excellent in the aforementioned various kinds of reliabilities, especially in the humidity proof reliability. And the various resins in the field of the art and known materials can be also used as the sealing material with label form or sheet form, for example, such as an epoxy resin, a polyimide resin, a maleimide resin, a silicone resin, an acrylic resin, etc. In the sealing resins, the polycarbodiimide resin is also a most preferred material as the sealing resin in the semiconductor of the present invention, in particular, owing to the low hygroscopic property. Each of these sealing resins may contain various materials known in the field of the art, such as various curing agents, curing catalysts, plasticizers, fillers, flame retardants, low-stress materials, etc as used in the transfer molding method.

Also, the material of the metal foil which is used as the base material for the sealing material of a label form or a sheet form can be optionally selected but is preferably Ni, Cu, Al, or an alloy such as the 42 alloy, the 45 alloy, and a stainless steel. Furthermore, the thickness of the metal foil is preferably thin as from about 6 to 150 μm for reducing the thermal stress occurring between the metal foil and the sealed resin.

In the present invention, by employing the constitution that the thickness of the adhesive layer for fixing a semiconductor element to the metal layer of the two-layer lead frame is defined to be from 100 to 350 μm and the semiconductor element is buried in the adhesive layer in the depth of at least ⅓ of the thickness of the semiconductor element, the various problems caused at resin sealing conventional semiconductor devices are solved and the semiconductor devices excellent in the mass productivity and the reliability when the devices are thinned are provided.

That is, the problem of a void and a die shift caused at resin sealing semiconductor devices of a thin type of about 0.8 mm in thickness by a transfer molding method is surely solved as the results that the extent of the unevenness of the space in the region filled with the sealing resin is softened and at the same time, the shift (transfer) of the semiconductor element by the stream of the sealing resin is restrained by burying the semiconductor element in the adhesive layer in the depth of at least 1/3 of the thickness of the semiconductor element.

Also, the occurrence of void in the sealed resin by the sheet molding method using a sealing resin formed into a label form or a sheet form is dissolved or greatly reduced by the following reasons.

That is, in the sheet molding method, the sealing resin of a label form or a sheet form is softened or melted by heating at sticking to a semiconductor element and is pressed to the surface of the semiconductor element by a molding pressure in the state described above, thereby the sealing resin is filled in the sealing region while passing round to gaps of the surrounding portion of the semiconductor element and in this case, according to the constitution of the present invention that the semiconductor element is buried in the adhesive layer in the depth of at least 1/3 of the thickness of the semiconductor element, the amount of projections of the semiconductor element from the adhesive layer becomes small, whereby the sealing resin in the softened or molten state can be easily passed round the surrounding of the semiconductor element and the occurrence of void can be restrained.

Also, by the two-layer lead frame of the present invention wherein the adhesive layer for adhering a semiconductor element to the metal layer is formed in a thickness of from 100 to 350 μm, the semiconductor device of the present invention can be directly obtained by only burying the a semiconductor element in the adhesive layer in a softened or molten state by heating in a definite depth of at least 1/3 of the thickness of the semiconductor element.

DETAILED DESCRIPTION OF THE PREFERRED EMBODIMENTS

Then, the example of practically producing a semiconductor device by applying the present invention is explained together with several comparative examples.

EXAMPLE

Figure 1:
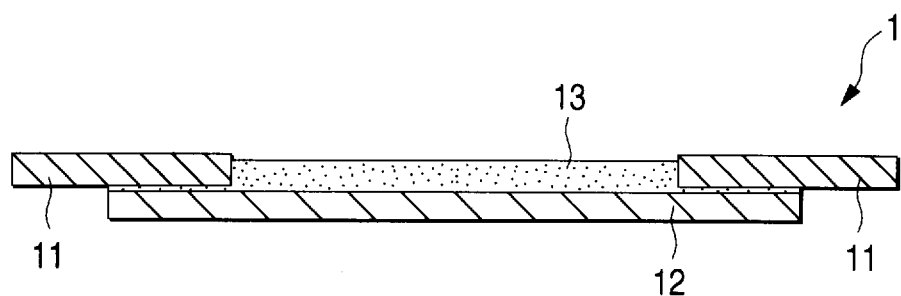
FIG. 1 is a schematic cross-sectional view showing the structure of the two-layer lead frame used in the example of the present invention.

A two-layer lead frame having the structure shown in FIG. 1 as a schematic cross-sectional view was employed. That is, in the two-layer lead frame 1 used in the example, lead portions 11 made of a copper alloy and having a thickness of 150 μm were laminated with a metal layer 12 made of copper and having a thickness of 70 μm each other, an adhesive layer 13 for fixing a semiconductor element was formed on one surface of the metal layer 12, and the thickness of the adhesive layer was 150 μm. The adhesive layer 13 was made up of a polycarbodiimide resin as the principal component and the metal layer 12 was adhered to the lead portions 11 with the adhesive layer. At the adhesion, the lead portions 11 were controlled by heat-pressing such that the each of the lead portions 11 was buried in the adhesive layer 13 in the depth of 120 μm.

Figure 2:
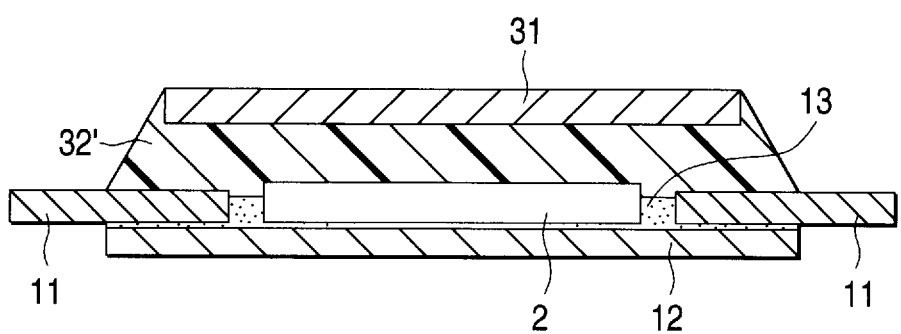
FIG. 2 is a schematic cross-sectional view showing the structure of the semiconductor device of the example of the present invention.
Figure 3:
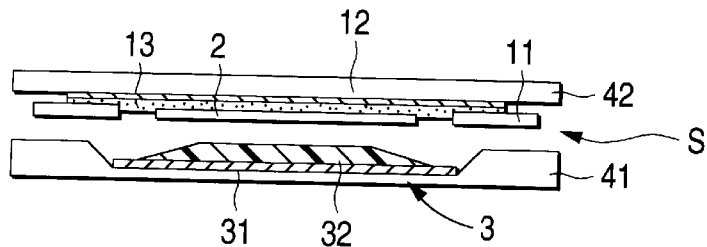
FIGS. 3(A) to 3(C) are schematic cross-sectional views explaining the resin-sealing process employed in the example of the present invention and each comparative example.
Figure 3:
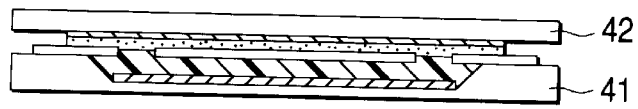
Figure 3:
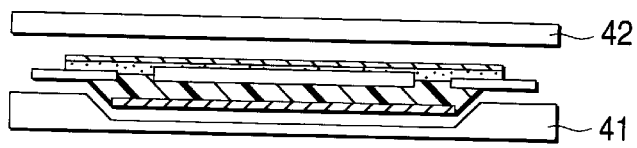

Using the two-layer lead frame 1 as described above, a QFP semiconductor device of 20 mm square and having a thickness of 0.6 mm as shown in FIG. 2 as a schematic cross-sectional view was produced by a resin sealing process as shown in FIGS. 3(A) to 3(C). In addition, in FIG. 2 and FIGS. 3(A) to 3(C), bonding wires connecting a semiconductor element 2 and the lead portions 11 are not shown in the figures.

The size of the semiconductor element 2 was 10 mm ×10 mm, the thickness thereof was 280 μm, before the resin sealing process shown in FIGS. 3(A) to 3(C), the semiconductor element 2 was adhered to the two-layer lead frame 1, and at the adhesion, the semiconductor element 2 was controlled by press-heating such that the semiconductor element 2 was buried in the adhesive layer 13 in the depth of of 120 μm.

For example, the lead portions 11 are buried at the condition of 250° C., 40 kg/cm$^2$ and the semiconductor element 2 is buried at the condition of 300° C., 10 kg/cm$^2$ while controling the buried depth by using the flip chip bonder.

For resin sealing of the semiconductor element, a sheet molding method using a label-form sealing member 3 as shown in FIG. 3(A) was employed. The label-form sealing member 3 had the structure that a sealing resin layer 32 made up of a polycarbodiimide resin as the principal component was formed on one surface of a metal foil 31 made of copper having a thickness of 35 μm, and the peripheral portions of the sealing resin layer 32 was slanted such that the sealing resin layer 32 had a convex form as a whole, whereby it was taken into consideration that at press-adhering the sealing resin layer 32 to the semiconductor element 2 in the sealing process, the surrounding gas was pushed away to outside to restrain the gas from entering between them. Also, as shown in the same figure, the sealing member 3 was inserted in one of a pair of upper and lower molding dies 41 and 42 and also the above-described assembly S comprising the two-layer lead frame 1 and the semiconductor element 2 was set onto the other molding die 42 such that the semiconductor element 2 faced the side of the sealing member 3.

Then, after molding the sealing resin layer 32 by closing the dies as shown in FIG. 3(B) while softening or melting the sealing resin layer 32 by heating the sealing member 3, by opening the dies as shown in FIG. 3(C), a semiconductor device having the structure that the circumference of the semiconductor element 2 was sealed with a resin 32', the metal layer 12 was exposed on one surface (first surface) of the semiconductor element 2, and the other surface (second surface) thereof was covered by the metal foil 31 as shown in FIGS. 2 and 3(C) was obtained.

EXAMPLE 2

The another example of the semiconductor device was manufactured as the same manner described in the aforementioned Example 1. The specifications of this example were as follows:

Thickness of the lead portion 11:250 μm

Thickness of the adhesive layer 13:300 μm

Buried depth of the lead portion 11 in the adhesive layer 13:200 μm

QFP semiconductor device:24 mm square, thickness 0.8 mm semiconductor element 2:12 mm×12 mm, thickness 370 μm Buried depth of the semiconductor element 2 in the adhesive layer 13:250 μm Heat-pressing condition was same as in the Example 1.

Comparative Example 1

Figure 4:
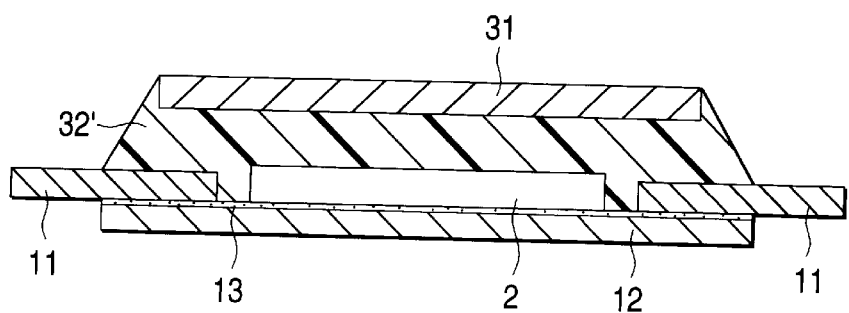
FIG. 4 is a schematic cross-sectional view showing the structure of the semiconductor device obtained in Comparative Example.

A semiconductor device was molded using the same materials as in Example described above and by the same resin sealing process as in Example but in this case, the thickness of the adhesive layer 13 for fixing the semiconductor element 2 to the metal layer 12 of the two-layer lead frame 1 was 20 μm. By the process, a semiconductor device having the structure as shown in FIG. 4 as the schematic cross-sectional view was obtained.

Comparative Example 2

A semiconductor device was molded using the same materials as in Example described above and by the same resin sealing process as in the above Example. However, both the amounts of the semiconductor element 2 and the lead portions 11 buried in the adhesive layer 13 were 20 μm.

Comparative Example 3

A semiconductor device was molded using the same materials as in Example described above and by the same resin sealing process as in Example. However, the thickness of the adhesive layer 13 for fixing the semiconductor element 2 to the metal layer 12 of the 2-layer lead frame 1 was 450 μm and the amounts of the semiconductor element 2 and the lead portions 11 buried in the adhesive layer were 200 μm and 100 μm respectively.

In the Comparative Example 3, many bonding wires connecting the semiconductor element 2 and the lead portions 11 were collapsed, whereby the production of a semiconductor device was substantially impossible. Evaluation of the Devices Obtained in the Examples and the Comparative Examples:

After applying a heat cycle test of 1,000 cycles to each of the semiconductor devices obtained in the examples and the comparative examples (excluding Comparative Example 3 wherein the production of a semiconductor device was impossible), the inside of each semiconductor device was observed by an X-ray radiographic apparatus.

As the results thereof, in comparative Examples 1 and 2, cracks were observed along the terminal portion to the inner lead portions but no change was observed in the Examples of the present invention.

As described above, according to the present invention, by employing the constitution that the thickness of the adhesive layer for fixing a semiconductor element to the metal layer of the two-layer lead frame is defined to be from 100 to 350 μm and the semiconductor element is buried in the adhesive layer in the depth of at least ⅓ of the thickness of the semiconductor element, it becomes possible to restrain the occurrences of the die shift of a semiconductor element in the resin sealing process and a void in the sealed resin and by applying the present invention to semiconductor devices of a thin type, in particular, of a thickness of 0.8 mm or thinner, both of the reliability and the mass productivity can be satisfied.

What is claimed is:

1. A semiconductor device comprising:

a metal layer;

a semiconductor element fixed on said metal layer by an adhesive layer; and a lead portion laminated on said metal layer;

wherein a thickness of the adhesive layer is from 100 to 350 μm and said semiconductor element is buried in the adhesive layer in a depth of at least ⅓ of a thickness of said semiconductor element.

2. The semiconductor device according to claim 1, wherein a thickness of the semiconductor device is from 400 to 800 μm.

3. The semiconductor device according to claim 1, wherein a surface of said metal layer which is opposite to a side of fixing said semiconductor element is exposed on a first surface of the semiconductor device.

4. The semiconductor device according to claim 1, further comprising a metal foil layer being formed on a second surface of the semiconductor device corresponding to a circuit surface side of said semiconductor element.

5. The semiconductor device according to claim 1, wherein a principal component of the adhesive layer is polycarbodiimide.

6. The semiconductor device according to claim 2, wherein a thickness of said semiconductor element is from 150 to 400 μm.

7. The semiconductor device according to claim 1, further comprising a sealing resin for sealing a circumference of said semiconductor element.

8. The semiconductor device according to claim 7, wherein a principal component of the sealing resin is polycarbodiimide.

9. A two-layer lead frame comprising:

a metal layer for mounting a semiconductor element via an adhesive layer; and a lead portion laminated on said metal layer;

wherein a thickness of the adhesive layer is from 100 to 350 μm.

10. The two-layer lead frame according to claim 9, wherein a principal component of the adhesive layer is polycarbodiimde.

* * * * *